(12) United States Patent
Beck et al.

(10) Patent No.: US 10,466,322 B2
(45) Date of Patent: Nov. 5, 2019

(54) MR IMAGING USING MULTI-ECHO K-SPACE ACQUISITION

(71) Applicant: KONINKLIJKE PHILIPS N.V., Eindhoven (NL)

(72) Inventors: Gabriele Marianne Beck, Eindhoven (NL); Alan Jerry Huang, Eindhoven (NL); Gerrit Hendrik Van Ijperen, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 196 days.

(21) Appl. No.: 15/312,805

(22) PCT Filed: May 22, 2015

(86) PCT No.: PCT/EP2015/061441
§ 371 (c)(1),
(2) Date: Nov. 21, 2016

(87) PCT Pub. No.: WO2015/181091
PCT Pub. Date: Dec. 3, 2015

(65) Prior Publication Data
US 2017/0199258 A1    Jul. 13, 2017

(30) Foreign Application Priority Data

May 27, 2014   (EP) ..................... 14170037

(51) Int. Cl.
*G01R 33/48* (2006.01)
*G01R 33/50* (2006.01)
(Continued)

(52) U.S. Cl.
CPC ..... *G01R 33/4818* (2013.01); *G01R 33/4828* (2013.01); *G01R 33/50* (2013.01);
(Continued)

(58) Field of Classification Search
None
See application file for complete search history.

(56) References Cited

U.S. PATENT DOCUMENTS 5,431,163 A * 7/1995 Kajiyama ............ G01R 33/482
324/309
7,330,602 B2   2/2008 Lee et al.
(Continued)

FOREIGN PATENT DOCUMENTS

JP        05329126 A    12/1993
WO   2013140276 A1     9/2013

OTHER PUBLICATIONS

Beck et al "A Novel Partial Averaging Approach for Reducing Motion Ghosting in Dixon TSE" Proceedings of the International Soc. for Magnetic Reson. in Med. vol. 23, May 15, 2015, p. 3649.
(Continued)

*Primary Examiner* — Douglas X Rodriguez

(57) ABSTRACT

An object to be MR imaged (10) is placed in an examination volume of a MR device (1). For faster MR imaging a multi-echo imaging technique which is robust with respect to motion is used. The method includes
generating echo signals by subjecting the object (10) to an imaging sequence,
acquiring the echo signals, each echo signal being attributed to a k-space line, wherein a number of k-space lines, which are adjacently arranged in a part of k-space, are repeatedly sampled, with said number of k-space lines being sampled in a different sequential order per repetition, and
reconstructing a MR image from the acquired echo signals.

20 Claims, 6 Drawing Sheets

(51) Int. Cl.
*G01R 33/56* (2006.01)
*G01R 33/561* (2006.01)
*G01R 33/565* (2006.01)

(52) U.S. Cl.
CPC ......... *G01R 33/56* (2013.01); *G01R 33/5615* (2013.01); *G01R 33/5616* (2013.01); *G01R 33/5617* (2013.01); *G01R 33/5618* (2013.01); *G01R 33/56509* (2013.01)

(56) References Cited

U.S. PATENT DOCUMENTS

| | | |
|---|---|---|
| 8,155,389 B2 | 4/2012 | Parker et al. |
| 2005/0253580 A1 | 11/2005 | Huang et al. |
| 2008/0061779 A1 | 3/2008 | Feiweier |
| 2008/0116891 A1* | 5/2008 | van der Kouwe ... G01R 33/561 324/312 |
| 2010/0164493 A1 | 7/2010 | Li et al. |
| 2012/0083687 A1 | 4/2012 | Parker et al. |
| 2013/0251225 A1 | 9/2013 | Liu et al. |
| 2013/0307537 A1 | 11/2013 | Yoshizawa et al. |
| 2014/0035582 A1 | 2/2014 | Boernert et al. |
| 2015/0022207 A1* | 1/2015 | Meyer ................ G01R 33/4818 324/309 |
| 2015/0185303 A1 | 7/2015 | Umeda et al. |

OTHER PUBLICATIONS

Guobin Li et al, "Reducing Fluctuation of Train Trajectories in 3D TSE Imaging With Compressed Sampling" Proc. of the Int. Soc. for Magn. Reson. in Med. vol. 21, Apr. 6, 2013 p. 3711.

Duan-Duan Liu et al "Under Sampling Trajectory Design for Compressed Sensing MRI" The Effect of Applied Compressive Loading on Tissue-Engineered Cartilage Constructs . . . Aug. 28, 2012 p. 73-76.

Tingfant Zhang et al "Variable Density K-Space Trajectories for Reducing Aliasing Artifacts in MRI Reconstruction" Multimedia Signal Processing Oct. 1, 2005 p. 1-4.

Pipe, "Motion Correction With Propeller MRI" . . . Magn. Reson. Med 42, p. 963-969 (1999).

* cited by examiner

MR IMAGING USING MULTI-ECHO K-SPACE ACQUISITION

CROSS REFERENCE TO RELATED APPLICATIONS

This application is a U.S. national phase application of International Application No. PCT/EP2015/061441, filed on May 22, 2015, which claims the benefit of EP Application Serial No. 14170037.7 filed on May 27, 2014 and is incorporated herein by reference.

FIELD OF THE INVENTION

The invention relates to the field of magnetic resonance (MR) imaging. It concerns a method of MR imaging of an object. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for imaging of soft tissue they are superior to other imaging methods in many respects, do not require ionizing radiation and are usually not invasive.

According to the MR method in general, the object, for example the body of the patient to be examined, is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

To realize spatial resolution in the body, constant magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to a MR image by means of an image reconstruction algorithm.

The so-called 'Turbo Spin Echo' (TSE) sequence is a well-known multi-echo imaging sequence. One 'shot' of the TSE sequence comprises an initial RF pulse for excitation of magnetic resonance followed by a plurality of rapidly applied (typically 180°) refocusing RF pulses generating a train of differently phase-encoded spin echo signals. The echo signals are acquired, wherein each echo signal represents a k-space line, i.e. a one-dimensional sample of k-space, the position of the k-space line being determined by the applied frequency encoding and phase encoding switched magnetic field gradients of the sequence. The so-called 'Turbo Factor' (TF) is the number of echoes acquired after each excitation. Typically, a plurality of shots of the multi-echo sequence is applied for completely sampling k-space in order to be able to reconstruct a MR image from the acquired k-space profiles. k-space is typically segmented such that each segment is attributed to one echo index number in the train of echoes generated by each shot of the sequence. In other words, each shot typically acquires k-space profiles from all segments of k-space, with the number of segments in k-space being equal to TF.

TSE sequences are applied today in almost all applications. Despite its wide use it is known to be very sensitive to motion due to the segmented k-space distributed acquisition. Small movements of the imaged object, for example of subcutaneous fat, can introduce ghosts overlapping with the part of interest disturbing the overall diagnostic value of a scan.

The above-mentioned k-space segmentation principles and problems do apply to both spin echo (TSE) and gradient echo sequences (TFE) and 'Echo Planar Imaging'—EPI—sequences.

Deriving motion information from correlations between sets of phase-encoding lines is known from the U.S. Pat. No. 8,155,389.

The US-patent application US2008/061779 concerns a magnetic resonance data acquisition for three-dimensional MR imaging. This data acquisition employs k-lines (in 3D k-space) that are distributed of partial acquisitions. That is, each partial acquisition includes a number of kx-profiles (in the frequency encoding direction). Respective $k_x$-profiles have different $(k_y,k_z)$ two-dimensional phase-encodings. Notably, in the $(k_y,k_z)$ plane a radial scanning approach is employed. An even distribution of k-profiles is employed (over the two-dimensional phase encoding plane) in the central and peripheral k-space over the entire measuring time.

SUMMARY OF THE INVENTION

From the foregoing it is readily appreciated that there is a need for an improved MR imaging technique. It is consequently an object of the invention to enable fast MR imaging which is more robust with respect to motion.

In accordance with the invention, a method of MR imaging of an object placed in an examination volume of a MR device is disclosed. The method comprises the steps of:
  generating echo signals by subjecting the object to an imaging sequence,
  acquiring the echo signals, each echo signal being attributed to a k-space line, wherein a number of k-space lines, which are adjacently arranged in a part of k-space, are repeatedly sampled, with said number of k-space lines being sampled in a different sequential order per repetition, and
  reconstructing a MR image from the acquired echo signals.

The k-space scanning approach is applied to the two-dimensional k-space (k-plane) spanned by the read-out (frequency encoding direction ($k_x$) and the phase-encoding direction ($k_y$). According to the invention, a number of k-space lines from a part of k-space are sampled repeatedly. This means that the same k-space lines of said number are sampled two or more times. The repeated sampling is performed for the purpose of signal averaging, for example. At different repetitions, the spin condition or magnetisation condition is selected to be different. For example, averaging is done over repetitions at different, notably opposite phases of the magnetisation. In Dixon acquisition, different echo times are selected in the different repetitions. In phase-sensitive inversion acquisition, different repetitions are made with and without application of a spin inversion, respectively. The respective repeatedly sampled k-space lines are sampled with a different sequential order per repetition in order to compensate for motion artefacts. The sequential order defines the order in which the k-space lines are successively sampled. The sequential order is determined by the attribution of the k-space position (i.e. the phase-encoding) of each k-space line to the position of the respective echo signal in the succession of acquired echo signals. This means, in other words, that the (for example random) sequential order in which the k-space lines are sampled by the imaging sequence is varied from repetition to repetition, which also implies that the temporal succession in which said number of k-space lines are acquired generally differs from the sequential arrangement of the respective k-space lines in the respective part of k-space. This approach achieves a particularly effective averaging-out of motion artefacts.

The imaging sequence applied according to the invention may be a single-echo spin echo (SE) or gradient echo (GE) sequence. In an alternative embodiment, the imaging sequence may be a multi-echo imaging sequence, wherein the object is subjected to a number of shots of the multi-echo imaging sequence, a train of echo signals being generated by each shot. In this embodiment, the sequential order in which said number k-space lines are acquired is determined by the attribution of the k-space position of each k-space line to an echo index number indicating the number of the respective echo signal in the train of echo signals generated by each shot.

In a further preferred embodiment of the invention, k-space is divided into a central k-space part and one or more peripheral k-space parts, wherein the number of signal averages in the central k-space part is higher than the number of signal averages in the peripheral k-space parts. According to this embodiment, the invention proposes a motion-insensitive partial averaging approach, in which the central part of k-space is sampled with a higher number of acquisitions for the purpose of signal averaging in order to compensate for motion artefacts. Different signal averaging is applied in the central and peripheral k-space parts, respectively. Motion artefacts are efficiently averaged out in the reconstructed MR image by applying a higher number of signal averages in the central k-space part than in the peripheral k-space parts since the central k-space data mainly determine the overall image contrast.

It is noted that signal averaging may be performed according to the invention in k-space or, for example by using an iterative MR image reconstruction technique, in image space.

Preferably, at least some of the repeatedly sampled k-space lines (of the central and/or peripheral k-space parts) are sampled in a random order. The randomization distributes motion-induced discontinuities of the acquired k-space data. This avoids a regular k-space spacing of motion-corrupted k-space data and, consequently, ghosting in the reconstructed MR image.

According to yet another preferred embodiment of the invention, at least a part of k-space is sampled with variable density. This means, in other words, that the acquired k-space lines are irregularly distributed in the phase-encoding direction. The variable k-space density adds to reduce ghosting by avoiding a regular distribution of motion-corrupted k-space samples in k-space.

Moreover, at least a part of k-space, preferably the peripheral k-space parts, may be incompletely sampled, which means that the sampling density in the respective k-space regions is below the Nyquist limit with regard to the field-of-view to be imaged.

This may be employed, for example, in order to reduce scan time by motion-optimized variable density compressed sensing. The theory of CS is known to have a great potential for significant signal data reduction. In CS theory, a signal data set which has a sparse representation in a transform domain can be recovered from undersampled measurements by application of a suitable regularisation algorithm. The possibility of undersampling leads to a significantly reduced acquisition time. As a mathematical framework for signal sampling and reconstruction, CS prescribes the conditions under which a signal data set can be reconstructed exactly or at least with high image quality even in cases in which the k-space sampling density is far below the Nyquist criterion, and it also provides the methods for such reconstruction. In most existing CS-based MR acquisition and reconstruction schemes the basic CS formulation is used which exploits only the prerequisite that the MR signal data is sparse in a transform domain.

Further, the method of the invention may be combined with the per se known 'partial matrix' technique. 'Partial matrix' is a scan time reduction method that takes advantage of the complex conjugate property of k-space. Since k-space profiles from negative k-space positions are substantially identical to complex conjugate k-space profiles from corresponding positive k-space positions, only a peripheral positive or negative part may be sampled in accordance with the invention in order to replicate a sampling of the entire k-space. This results in a significant reduction in scan time while full resolution is maintained.

According to a preferred embodiment of the invention, the multi-echo imaging sequence of the invention is a spin echo sequence, of which one shot comprises:
  at least one RF pulse for excitation of magnetic resonance,
  a plurality of refocusing RF pulses,
  a plurality of switched magnetic field gradients for frequency-encoding of each echo signal, and a plurality of switched magnetic field gradients for phase-encoding of each echo signal. In other words, the method of the invention may be applied in combination with per-se known 'turbo' spin echo sequences, such as TSE or spin echo-type EPI. Alternatively, the multi-echo imaging sequence is a gradient echo sequence, of which one shot comprises:

at least one RF pulse for excitation of magnetic resonance, a plurality of switched magnetic field gradients for refocusing magnetic resonance and for frequency-encoding of each echo signal, and a plurality of switched magnetic field gradients for phase-encoding of each echo signal. In other words, the method of the invention may be applied in combination with per-se known 'turbo' gradient echo sequences, such as TFE or EPI.

The method of the invention is particularly well-suited to be combined with Cartesian k-space sampling schemes. However, the method may as well be applied in combination with non-Cartesian sampling. For all types of k-space sampling, the term 'central k-space part' within the meaning of the invention refers to k-space profiles close to and encompassing the k-space origin.

According to yet another preferred embodiment, motion information is derived from the echo signals acquired from the repeatedly sampled k-space lines. For example, echo signals acquired from the same k-space positions at different points in time may be correlated in order to extract motion information. The motion information may be employed for corresponding motion compensation of the acquired signal data by appropriate post-processing. Alternatively, if the detected motion is found to be too severe to be compensated for, it may be decided automatically to discard the motion-corrupted k-space profiles. Thus, motion artefacts are either averaged out according to the invention or completely avoided by correcting or discarding the corrupted data.

As known to those skilled in the field of MR imaging, it is often desired to obtain information about the relative contribution of different chemical species, such as water and fat, to the overall signal, either to suppress the contribution of some of them or to separately or jointly analyze the contribution of all of them. These contributions can be calculated if information from two or more corresponding echoes, acquired at different echo times, is combined. This may be considered as chemical shift encoding, in which an additional dimension, the chemical shift dimension, is defined and encoded by acquiring two or more echo signal data sets at slightly different echo times. In particular for water-fat separation, these types of experiments are often referred to as Dixon-type of measurements. By means of Dixon imaging or Dixon water/fat imaging, a water/fat separation can be achieved by calculating contributions of water and fat from two or more corresponding echoes, acquired at different echo times. In general such a separation is possible because there is a known precessional frequency difference of hydrogen in fat and water. In its simplest form, water and fat images are generated by either addition or subtraction of the 'in phase' and 'out of phase' datasets.

In a preferred embodiment, the method of the invention is combined with Dixon imaging. Thus, in other words, the imaging sequence is a Dixon sequence, wherein signal contributions from water and fat to the acquired echo signals are separated. It is an important insight of the invention that the particularly motion-robust acquisition scheme of the invention is well-suited for Dixon imaging, wherein the low motion artefacts in the reconstructed MR image leads to a high diagnostic image quality. In the case of Dixon imaging, the repeated sampling of identical k-space lines may advantageously be performed with a different echo time per repetition.

Most preferably, the echo signals are acquired at each echo time of the Dixon sequence with a different order of the k-space lines. A different randomisation of the acquisition order results in an optimized averaging-out of motion artefacts.

This applies in particular in combination with the reconstruction of a so-called modulus-added weighted fat and water image, wherein the signal contributions from water and fat are combined in the step of reconstructing the MR image. For reconstructing a modulus-added weighted fat and water image, the nth root of the weighted sum of the modulus of the fat contribution raised to the power n and the modulus of the water contribution raised to the power n is computed for each image pixel or voxel.

More generally, the method of the invention may be combined with any type of imaging technique in which k-space lines are repeatedly acquired and at least one imaging parameter is varied from repetition to repetition. Hence, the method of the invention may be combined advantageously with inversion recovery techniques (IR/PSIR), diffusion-weighted imaging, magnetization transfer contrast (MTC), chemical exchange saturation transfer (CEST) and so forth.

In a further aspect of the invention, phase-sensitive magnetic resonance images are reconstructed in that phase-information of the acquired magnetic resonance signal is preserved in the reconstruction. That is, pixels of the reconstructed magnetic resonance images are complex valued.

The method of the invention described thus far can be carried out by means of a MR device including at least one main magnet coil for generating a uniform static magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit. The method of the invention can be implemented, for example, by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
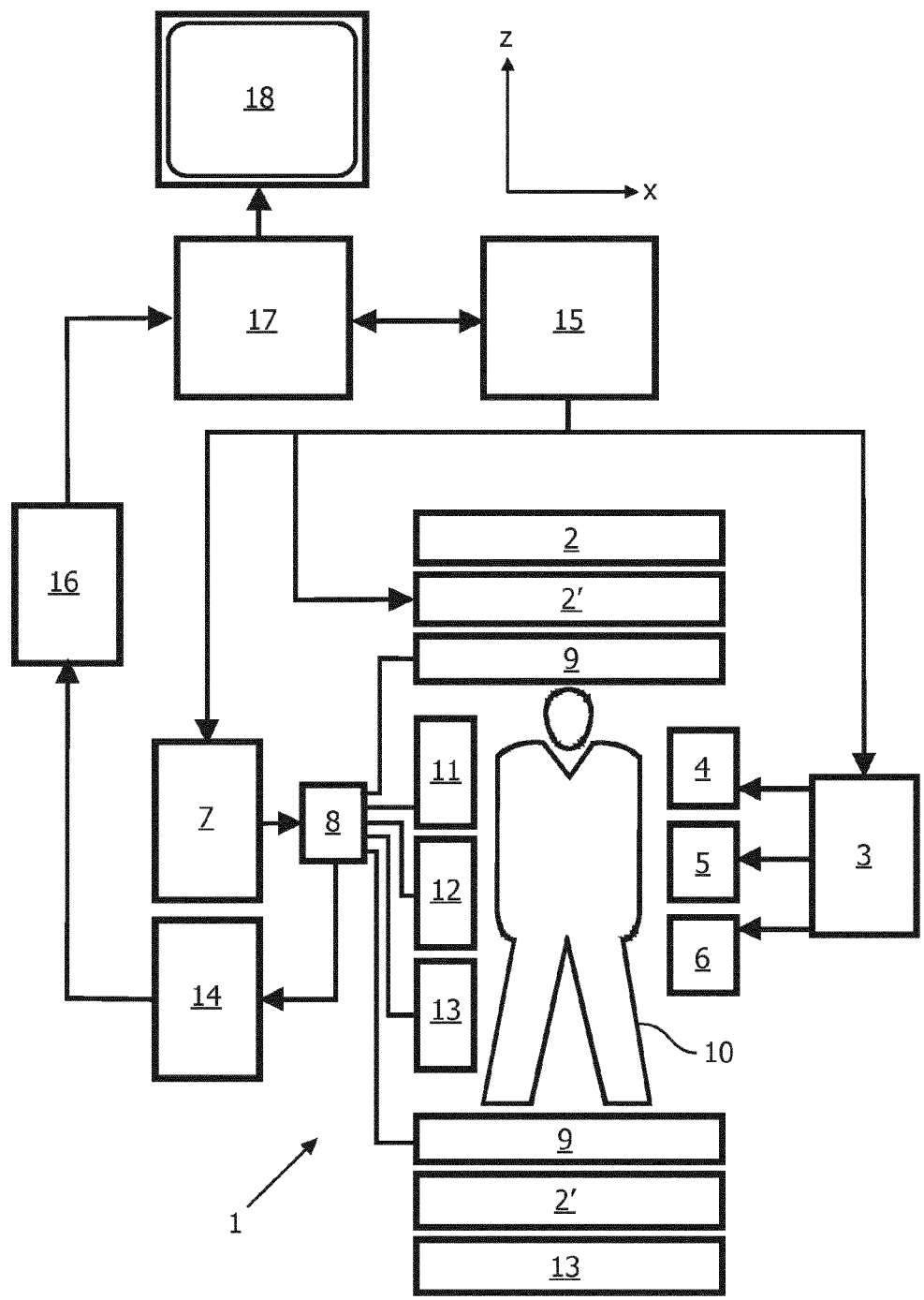
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform
MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9.

For generation of MR images of limited regions of the body 10, a set of local array RF coils 11, 12, 13 are placed contiguous to the region selected for imaging. The array coils 11, 12, 13 can be used to receive MR signals induced by body-coil RF transmissions.

The resultant MR signals are picked up by the whole body volume RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo (TSE) imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

With continuing reference to FIG. 1 and with further reference to FIGS. 2-5, embodiments of the motion-robust partial averaging approach of the invention are explained.

According to the invention, the body 10 is subjected to a number of shots of a multi-echo imaging sequence, such as, for example, a TSE sequence. A train of echo signals is generated by each shot of the sequence. The echo signals are acquired, wherein each echo signal is attributed to a k-space line. The k-space lines are represented in FIGS. 2-5 as thin horizontal lines extending parallel to the $k_x$ axis. Signal averaging is performed by repeatedly sampling at least some of the k-space lines. Repeated sampling means that identical k-space lines are sampled two or more times during the signal acquisition process for reconstructing the final MR image, wherein a signal to noise improvement is achieved by taking the average of the several echo signals acquired from the same k-space positions respectively. The number of averages is also referred to as the number of acquisitions (NSA). The approximate amount of improvement in signal to noise (SNR) is calculated as the square root of the number of averages.

Figure 2:
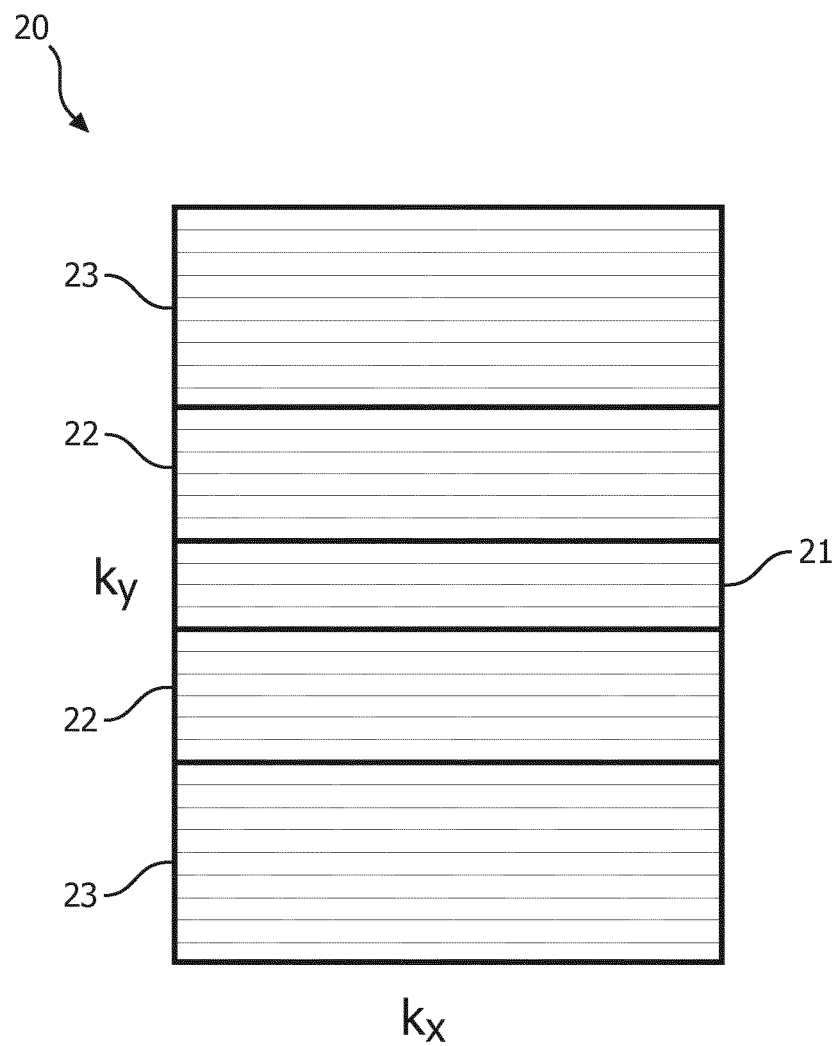
FIG. 2 shows a diagram of k-space schematically illustrating a first embodiment of the sampling scheme of the invention.

As shown in FIG. 2, k-space 20 is divided into a central k-space part 21, a first peripheral k-space part 22, and a second peripheral k-space part 23. In the depicted embodiment, the central k-space part 21 is sampled by each shot of the TSE sequence, first peripheral k-space part 22 is sampled by every $2^{nd}$ shot, while second peripheral k-space part 23 is sampled by every $4^{th}$ shot. According to the proposed partial averaging approach, a variable repeated sampling of k-space positions is performed, wherein central k-space 21 is acquired more often compared to the peripheral parts 22, 23. The central k-space part 21 with its limited set of k-space lines is sampled very frequently. Motion information may be derived from the echo signals acquired from the repeatedly sampled k-space lines of central part 21. For example, cross correlations of the k-space data acquired during different averaging steps may be computed. On this basis, an automated motion compensation may be performed. In case the detected motion is found to be too severe, the corresponding echo signal data may be rejected. In case the position of the imaged object is found to have irreversibly changed due to motion, the scan parameters may be updated automatically according to the position shift. The intermediate peripheral k-space part 22 with a larger set of k-space lines is scanned less frequently to average out motion, compensate for artefacts and signal decay effects like $T_2$ relaxation, and to provide at least a certain improvement of SNR. The second peripheral part 23 is acquired only once. It may be acquired even less than once depending on whether, for example CS and/or partial matrix techniques are used. Finally, a MR image is reconstructed from the acquired echo signals. This general approach can be applied to all types of sequences, like FFE, SE, TFE, TSE and EPI sequences.

Figure 3:
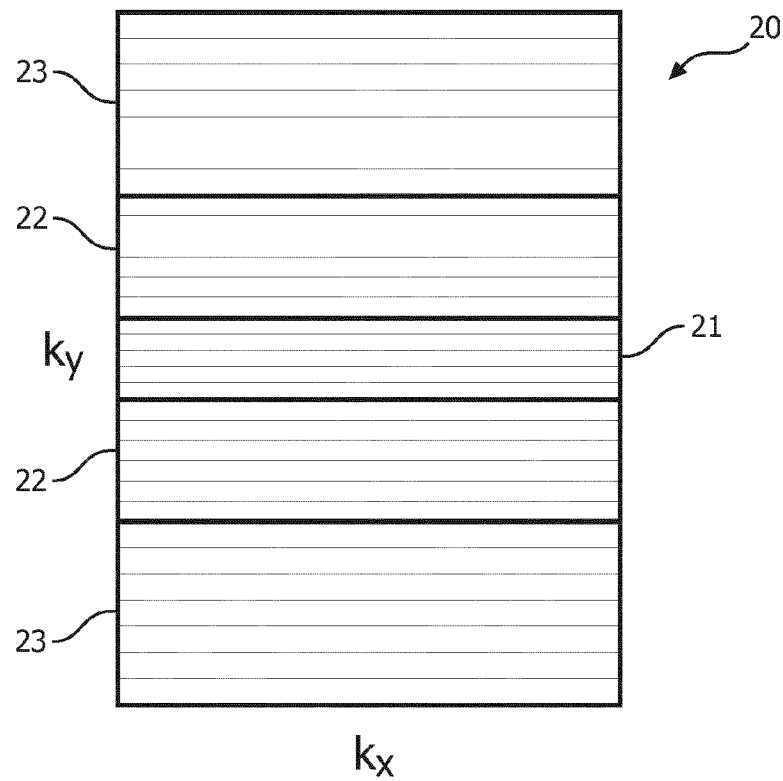
FIG. 3 shows a diagram of k-space schematically illustrating a second embodiment of the sampling scheme of the invention.
Figure 4:
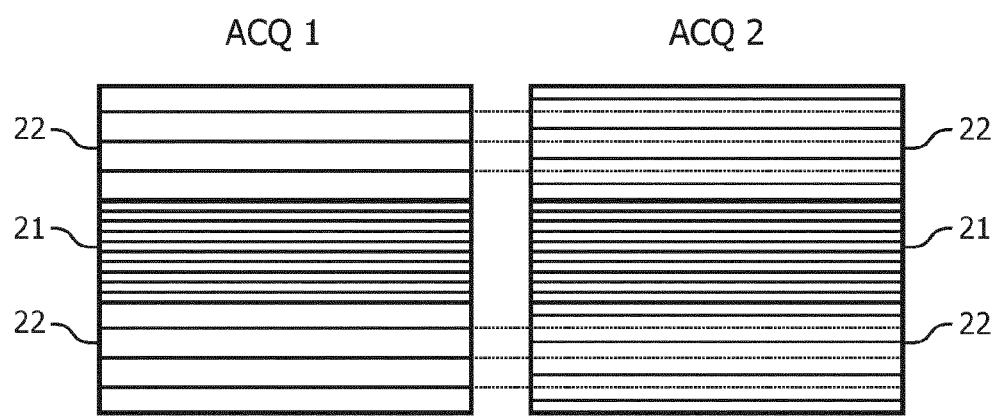
FIG. 4 shows a diagram of k-space schematically illustrating a third embodiment of the sampling scheme of the invention.
Figure 5:
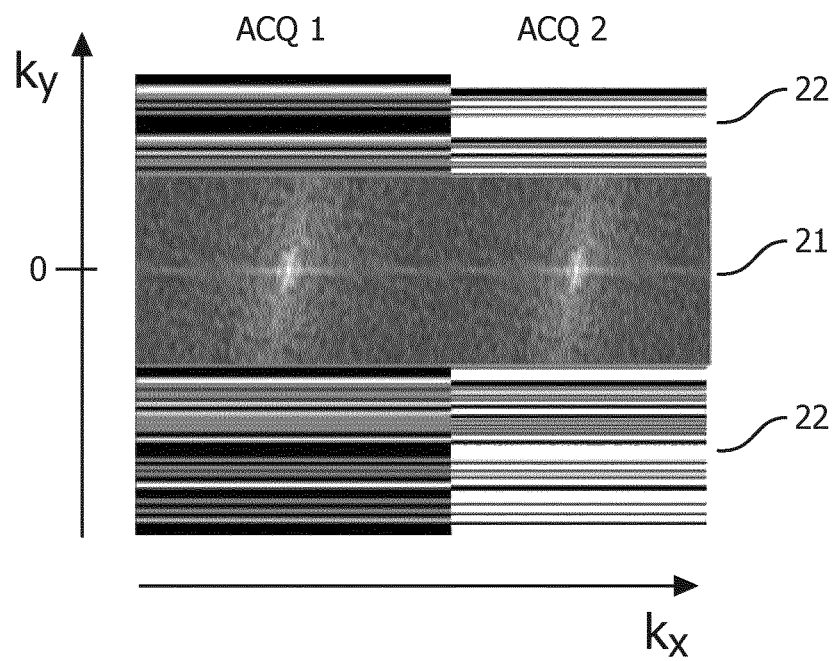
FIG. 5 shows a diagram of k-space schematically illustrating a fourth embodiment of the sampling scheme of the invention.

A further aspect of the invention, which is illustrated in FIGS. 3-5, is that k-space sampling is performed with variable density, with a denser sampling of k-space in the central k-space part 21 and a sparser sampling of the peripheral k-space parts 22, 23. As illustrated in FIGS. 3-5, the acquired k-space lines are irregularly distributed in the phase-encoding direction $k_y$. The variable k-space density effects a reduction of ghosting by avoiding a regular distribution of motion-corrupted k-space samples in k-space 20. This variable density acquisition is especially advantageous in turbo sequences like TSE or TFE, wherein the image contrast is preserved and is essentially independent of the choice of the number of acquisitions in the peripheral k-space parts 22, 23. As in the embodiment shown in FIG. 2, the central k-space part is updated more often, whereas the peripheral k-space parts 22, 23 are updated with a decreased frequency. Consequently, the most relevant, signal dominating k-space lines from central k-space 21 are updated within a short time period (for example within each shot of the multi-echo imaging sequence). In addition, the size of the k-space parts 21, 22, 23 increases to outer k-space, which results in a further distribution of motion induced k-space discontinuities over k-space 20.

FIG. 4 illustrates the k-space lines acquired during a first and second acquisition step designated as ACQ1 and ACQ2 respectively. In this embodiment, the positions of the k-space lines in the peripheral k-space part 22 are shifted in the second acquisition step ACQ2 in the $k_y$-direction. The $k_y$ positions of the k-space lines in the first acquisition step ACQ1 are indicated as dotted lines in the right diagram of FIG. 4 for the purpose of illustration. In the central k-space part 21, in contrast, the $k_y$ positions of the k-space lines scanned during the first and second acquisition steps ACQ1 and ACQ2 are maintained, resulting in a correspondingly repeated sampling of the k-space lines in the central k-space part 21, while each k-space line in the peripheral k-space part 22 is scanned only once. During each individual acquisition step ACQ1, ACQ2, the peripheral k-space part 22 is incompletely sampled, which means that the sampling density in the $k_y$ direction is below the Nyquist threshold. The combination of the k-space lines sampled in both acquisition steps ACQ1, ACQ2 results in a completely sampled data set.

The main aspect of the invention is the repeated sampling of the respective k-space lines in a different order in each repetition, wherein the sampling order defines the temporal order in which the k-space lines are sampled. Preferably, a different random order is applied per acquisition step. The technique of the invention, which is applied in combination with all embodiments of the invention illustrated in FIGS. 2-5, averages out motion artefacts and distributes motion-induced discontinuities of the acquired k-space data resulting in an irregular k-space spacing of motion-corrupted k-space data. Ghosting in the reconstructed MR image is avoided in this way. For example, with reference to FIG. 4, the (preferably random) temporal order in which the k-space lines are sampled from the central k-space part 21 during acquisition step ACQ2 is different from the temporal sampling order applied in the central k-space part 21 during acquisition step ACQ1.

In the embodiment illustrated in FIG. 5, a random distribution of the k-space sampling grid is applied in the peripheral k-space part 22, wherein those k-space lines are sampled during acquisition step ACQ2 that have been missed out during acquisition step ACQ1. The combination of both acquisitions ACQ1, ACQ2 results in a fully sampled data set. Like in the embodiment of FIG. 4, central k-space part 21 is fully sampled during each acquisition step ACQ1, ACQ2 such that repeated sampling is achieved. The random undersampling of the peripheral k-space part 22 during each acquisition step ACQ1, ACQ2 results in a yet further improved distribution of motion-corrupted k-space samples over k-space and, consequently, in a further improved motion robustness.

Figure 6:
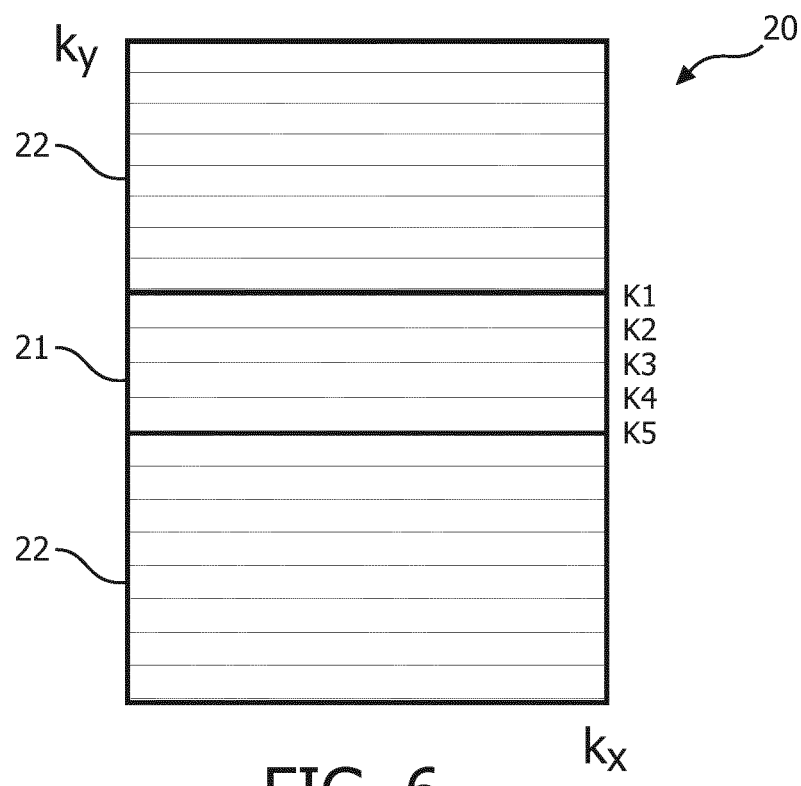
FIG. 6 shows a diagram of k-space schematically illustrating a fourth embodiment of the sampling scheme of the invention.

In the embodiment shown in FIG. 6, again k-space 20 is divided into a central k-space part 21 and a peripheral k-space part 22. Central k-space part 21 is repeatedly sampled by correspondingly repeated application of a single-echo spin echo (SE) sequence in the depicted embodiment. The central k-space part 21 comprises a limited number of adjacently arranged k-space lines that are designated as K1, K2, K3, K4, K5. Each k-space line K1, K2, K3, K4, K5 corresponds to an echo signal generated by the SE sequence. The k-space lines K1, K2, K3, K4, K5 are repeatedly sampled with a different sequential order per repetition according to the invention. The sequential order may be varied as follows during, for example, four repetitions:

Repetition no. 1: K1, K2, K3, K4, K5;
Repetition no. 2: K2, K1, K4, K3, K5;
Repetition no. 3: K2, K4, K1, K5, K3;
Repetition no. 4: K3, K5, K2, K4, K1.

Signal averaging is performed on this basis to average out motion, compensate for artefacts and signal decay effects like $T_2$ relaxation, and to provide an improvement of SNR. The peripheral k-space part 22 is scanned only once. Finally, a MR image is reconstructed from the acquired echo signals.

Figure 7:
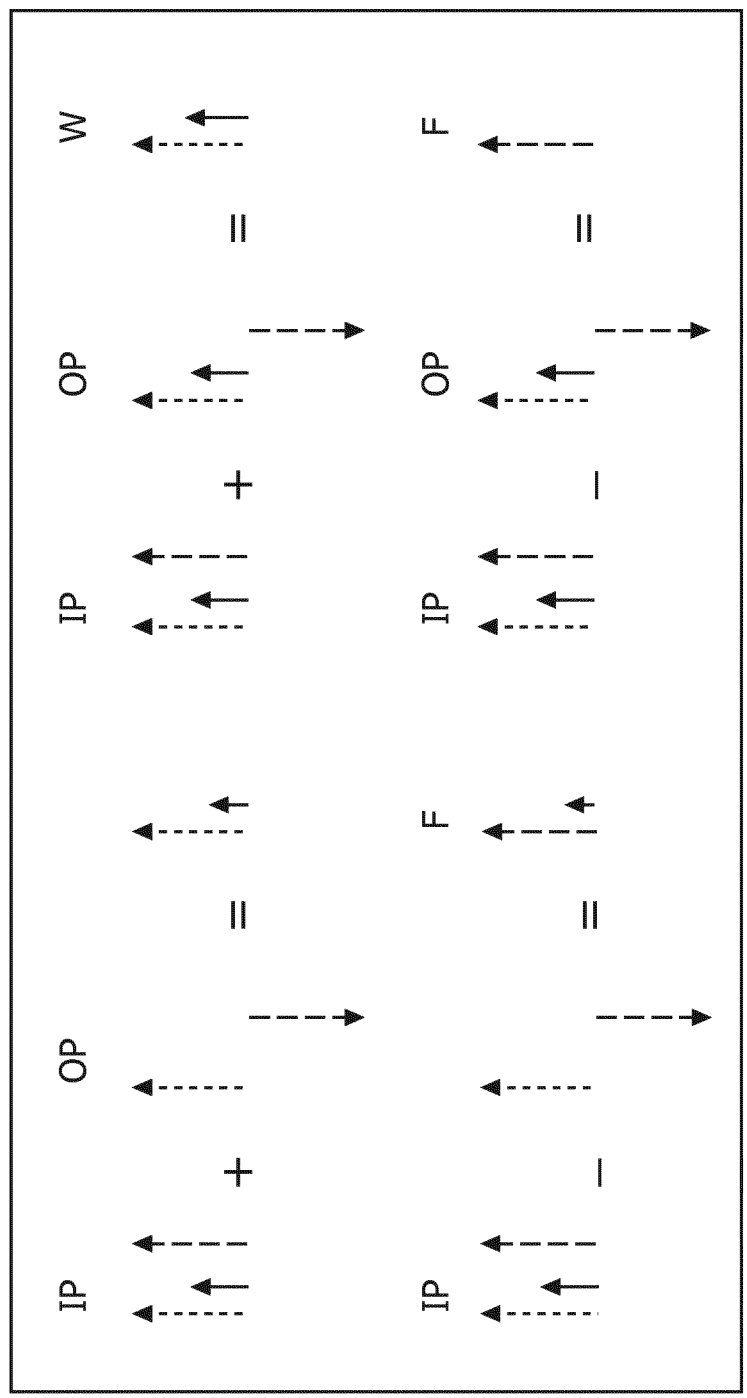
FIG. 7 shows schematically the in-phase, out-of-phase, water and fat images with motion ghost contributions.

In Dixon-type measurements, motion ghosts are typically encoded in the water or fat image dependent on the spectral source as shown for the simple in-phase out-phase Dixon example of FIG. 7, (W=IP+OP, F=IP−OP). Here water motion leads to a motion ghost) with the full amplitude in the water image and not in the fat image. The left portion of FIG. 7 relates to uncorrelated motion, the right portion of Figure relates to correlated motion.

In case motion is uncorrelated as shown for the simple in-phase out-phase Dixon example below left the motion ghost is present in both water and fat images, nevertheless the artefact is reduced by a factor of 2. This averaging effect can be used to effectively reduce motion artefacts.

Figure 8:
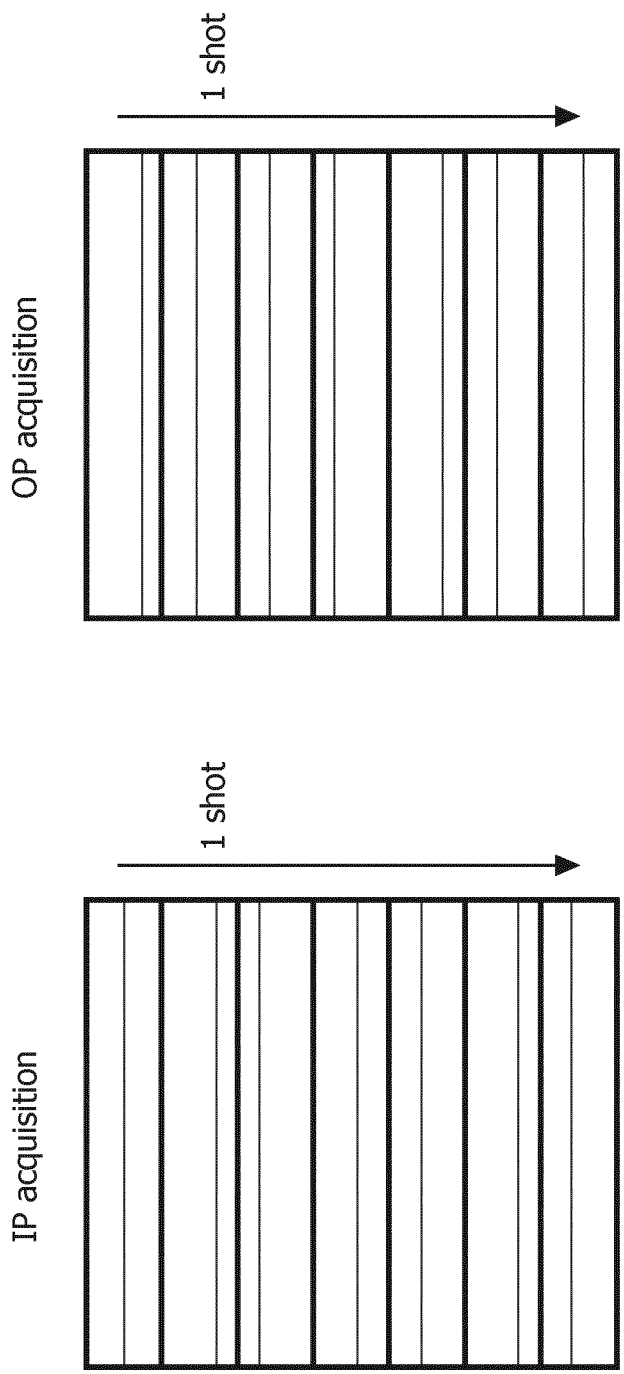
FIG. 8 shows a diagram of k-space schematically illustrating sampling of in-phase and out-of-phase in a Dixon measurement.

In DIXON TSE the different profile ordering per Dixon acquisition can be achieved by a different, for example, randomized ordering of shots as illustrated below. Per shot a profile is acquired per k-space segment (in the example of FIG. 8) 7 profiles out of the 7 k-space segments are sampled). The unequidistant or random sampling of profiles (dotted lines) in a shot is varied for the Dixon acquisitions e. g. for IP and OP acquisitions. In case of motion this different sampling per Dixon acquisition leads to a motion ghost that is uncorrelated in the IP and OP acquisition. Applying Dixon reconstruction this motion ghost is averaged out.

According to one aspect of the invention k-space parts are randomly ordered with a different sequential, preferably random, order per Dixon acquisition.

For turbo sequences, like TSE or TFE, profiles acquired over shots and hence positioned close in k-space within k-space segments are randomly distributed and this random order changes with the Dixon acquisition.

For non-turbo sequences like FFE, k-space is subdivided in k-space segments with a random subsegment ordering. The random subsegment ordering is changed per Dixon acquisition.

The averaging effect is enhanced the more Dixon acquisitions are used. Hence in case of Dixon quantification where typically six (6) echoes are used the averaging effect is optimized.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A method of magnetic resonance (MR) imaging of an object placed in an examination volume of a MR device, the method comprising the steps of:
generating echo signals by subjecting the object to a multi-echo imaging sequence, wherein the object is subjected to a number of shots of the multi-echo imaging sequence, a train of echo signals being generated by each shot;
acquiring the echo signals, each of the echo signals being attributed to a k-space line such that a plurality of k-space lines are repeatedly sampled in each of a central k-space part and at least one peripheral k-space part, the central k-space part being sampled with a higher k-space density than the at least one peripheral k-space part, the k-space lines in at least one of the central k-space part, and the at least one peripheral k-space part being repeatedly sampled at different selected spin conditions per repetition, in a plurality of first repetitions contributions to the train of the echo signals for two or more substances are in a first relative phase relationship and in a plurality of second repetitions, the contributions to the train of echoes for the two or more substances are in a second phase relationship, the second phase relationship being different from the first phase relationship;
deriving motion information from the repeatedly sampled k-space lines; and
reconstructing an MR image indicative of at least one of the substances, or a combination of the substances.

2. The method of claim 1, wherein the at least one peripheral k-space part includes a near peripheral k-space part and a far peripheral k-space par and wherein the first and second relative phase relationships include in-phase and out-of-phase.

3. The method of claim 1, wherein at least one part of k-space is repeatedly sampled with variable density, the number of k-space lines sampled being different in each of a plurality of the repeated sampling of the at least one part of k-space, wherein the number of k-space lines sampled is a plural number.

4. The method of claim 1, wherein a plurality of the repeatedly sampled k-space lines in a central k-space part are sampled in a random sequential order which changes randomly with each repetition.

5. The method of claim 1 wherein at least a part of k-space is incompletely sampled in each of a plurality of repetitions, and completely sampled over the plurality of repetitions.

6. The method of claim 1, wherein motion information is derived from the echo signals acquired from the repeatedly sampled k-space lines.

7. The method of claim 1, wherein the MR image is reconstructed using compressed sensing.

8. The method of claim 1, wherein the imaging sequence is a Dixon sequence, in which different echo times are selected in respective repetitions wherein signal contributions from water and fat to the acquired echo signals are separated.

9. The method of claim 8, wherein the echo signals are acquired at two or more different echo times, with the echo signals being acquired at each echo time with a different sequential order of the k space lines.

10. The method of claim 1, wherein the imaging sequence includes one of a spin echo sequence, a gradient echo sequence, and an inversion recovery sequence comprising an inversion RF pulse followed by an excitation RF pulse after an inversion recovery time.

11. A magnetic resonance (MR) device including at least one main magnet coil for generating a uniform, static magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit, wherein the MR device is arranged to perform the method of claim 1.

12. A non-transitory computer readable medium carrying a computer program which when executed on a magnetic resonance (MR) device, performs the method of claim 1.

13. A method of magnetic resonance (MR) imaging of an object placed in an examination volume of an MR device, the method comprising:
generating echo signals by subjecting the object to a plurality of multi-echo imaging sequences, each of the plurality of multi-echo imaging sequences including a resonance excitation shot followed by a train of the echo signals;
acquiring the echo signals, each of the echo signals being attributed to a k-space line such that a plurality of k-space lines are repeatedly sampled in each of a central k-space part, a near peripheral k-space part, and a far peripheral k-space part, the central k-space part being sampled with a higher k-space density than the near peripheral k-space part and the near peripheral k-space part being sampled with a higher density than the far peripheral k-space part, the k-space lines in at least one of the central k-space part, the near peripheral k-space part, and the far peripheral k-space part being repeatedly sampled in different sequential orders and at different selected spin conditions per repetition, in a plurality of first repetitions contributions to the train of the echo signals for two substances are in-phase and in a plurality of second repetitions, the contributions to the train of echoes for the two substances are out-of-phase;
deriving motion information from the repeatedly sampled k-space lines; and
reconstructing an MR image indicative of at least one of the first substance, the second substance, or a combination of the first and second substances.

14. The method of claim 13, wherein the first and second substances include fat and water.

15. The method of claim 13, wherein at least one part of k-space is repeatedly sampled with variable density, the number of k-space lines sampled being different in each of a plurality of the repeated sampling of the at least one part of k-space, wherein the number of k-space lines sampled is a plural number.

16. The method of claim 15, wherein echo signals attributable to the first and second substances are acquired at different echo times, at each echo time, the k-space lines being acquired with a different sequential order.

17. The method of claim 16, wherein the echo signals are acquired with an inversion recovery sequence including an inversion RF pulse followed after an inversion recovery time by the resonance excitation shot.

18. A magnetic resonance (MR) device including a main magnet configured to generate a uniform, static magnetic field within an examination volume, a plurality of gradient coils configured to generate switched magnetic field gradients in different spatial directions within the examination volume, at least one RF coil configured to generate RF pulses within the examination volume and/or to receive MR signals from an object positioned in the examination volume, a control processor configured to control the plurality of gradient coils and the at least one RF coil to perform the method of claim 13.

19. A non-transitory computer readable medium carrying a computer program which when executed on a magnetic resonance (MR) device, performs the method of claim 13.

20. A magnetic resonance (MR) imaging device comprising:
a main magnet configured to generate a uniform, static magnetic field within an examination volume;
magnetic field gradient coils configured to apply switched magnetic field gradients in different spatial directions within the examination volume;
at least one RF coil configured to generate RF pulses within the examination volume and/or receive MR signals from an object positioned in the examination volume;
a computer processor configured to:
control the magnetic field gradient coils and the at least one RF coil to generate echo signals by subjecting the object to a plurality of multi-echo imaging sequences, each of the plurality of multi-echo imaging sequences including a resonance excitation shot followed by a train of the echo signals,
acquire the echo signals, each of the echo signals being attributed to a k-space line such that a plurality of k-space lines are repeatedly sampled in each of a central k-space part, a near peripheral k-space part, and a far peripheral k-space part, the central k-space part being sampled with a higher k-space density than the near peripheral k-space part and the near peripheral k-space part being sampled with a higher density than the far peripheral k-space part, the k-space lines in at least one of the central k-space part, the near peripheral k-space part, and the far peripheral k-space part being repeatedly sampled at different selected spin conditions per repetition, in a plurality of first repetitions contributions to the train of the echo signals for first and second substances are in-phase and in a plurality of second repetitions, the contributions to the train of echoes for the first and second substances are out-of-phase,
derive motion information from the repeatedly sampled k-space lines, and
reconstruct an MR image indicative of at least one of the first substance, the second substance, or a combination of the first and second substances; and
a display device configured to display the reconstructed MR image.

* * * * *